(12) United States Patent
Deng et al.

(10) Patent No.: US 11,904,703 B2
(45) Date of Patent: Feb. 20, 2024

(54) ELECTRIC VEHICLE AND METHOD AND APPARATUS FOR CALCULATING ENDURANCE MILEAGE OF ELECTRIC VEHICLE

(71) Applicant: BYD COMPANY LIMITED, Guangdong (CN)

(72) Inventors: Linwang Deng, Shenzhen (CN); Zihua Yang, Shenzhen (CN); Tianyu Feng, Shenzhen (CN); Chun Lv, Shenzhen (CN); Siqi Lin, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 731 days.

(21) Appl. No.: 17/042,780

(22) PCT Filed: Mar. 25, 2019

(86) PCT No.: PCT/CN2019/079451
§ 371 (c)(1),
(2) Date: Sep. 28, 2020

(87) PCT Pub. No.: WO2019/184846
PCT Pub. Date: Oct. 3, 2019

(65) Prior Publication Data
US 2021/0016664 A1    Jan. 21, 2021

(30) Foreign Application Priority Data
Mar. 30, 2018   (CN) .......................... 201810296299.8

(51) Int. Cl.
*B60L 3/00*     (2019.01)
*G01R 31/3835*  (2019.01)
(Continued)

(52) U.S. Cl.
CPC ................ *B60L 3/00* (2013.01); *B60L 50/60* (2019.02); *B60L 58/12* (2019.02);
(Continued)

(58) Field of Classification Search
CPC .......... B60L 50/60; B60L 50/50; B60L 58/10; B60L 3/00; B60R 16/02; G01R 31/50
See application file for complete search history.

(56) References Cited

U.S. PATENT DOCUMENTS

| 7,466,138 B2 | 12/2008 | Cho et al. |
| 2006/0244458 A1 | 11/2006 | Cho et al. |

(Continued)

FOREIGN PATENT DOCUMENTS

| CN | 101142542 A | 3/2008 | |
| CN | 102358190 A * | 2/2012 | ............... B60L 3/00 |

(Continued)

OTHER PUBLICATIONS

PCT International Search Report, PCT/CN2019/079451, dated Jun. 5, 2019, 4 Pages.

*Primary Examiner* — Yuri Kan

(57) ABSTRACT

Provided is an electric vehicle driving mileage calculation method, comprising the following steps: calculate the energy consumption of a power battery of the electric vehicle per unit driving mileage; obtain the open-circuit voltage (OCv)-battery capacity (Q) reference curve of the power battery; obtain the OCv of the power battery; obtain the currently remaining available energy of the power battery according to the OCv and the OCv-Q reference curve of the power battery; calculate the driving mileage of the electric vehicle according to the energy consumption of the power battery per unit driving mileage and the currently remaining available energy of the power battery, whereby the driving mileage of the electric vehicle which is calculated is more accurate. Also disclosed is an electric-vehicle driving mileage calculation device and an electric vehicle.

18 Claims, 2 Drawing Sheets

(51) Int. Cl.
  *B60L 50/60* (2019.01)
  *B60L 58/12* (2019.01)
(52) U.S. Cl.
  CPC ...... *G01R 31/3835* (2019.01); *B60L 2240/54* (2013.01); *B60L 2260/52* (2013.01); *B60L 2260/54* (2013.01)

(56) References Cited

U.S. PATENT DOCUMENTS

| | | |
|---|---|---|
| 2013/0179061 A1 | 7/2013 | Gadh et al. |
| 2017/0212203 A1 | 7/2017 | Young et al. |
| 2017/0361729 A1 | 12/2017 | Bryngelsson et al. |

FOREIGN PATENT DOCUMENTS

| | | | | | |
|---|---|---|---|---|---|
| CN | 102358190 A | | 2/2012 | | |
| CN | 102590754 A | | 7/2012 | | |
| CN | 105459842 A | * | 4/2016 | ............. | B60L 58/10 |
| CN | 105459842 A | | 4/2016 | | |
| CN | 105904981 A | * | 8/2016 | ............. | B60L 50/50 |
| CN | 106207288 A | | 12/2016 | | |
| CN | 107192914 A | * | 9/2017 | ............. | G01R 31/50 |
| CN | 107406004 A | | 11/2017 | | |
| CN | 107696896 A | | 2/2018 | | |
| CN | 107757527 A | * | 3/2018 | ............. | B60R 16/02 |
| CN | 107757527 A | | 3/2018 | | |
| JP | 2015139346 A | | 7/2015 | | |
| WO | 2016198674 A1 | | 12/2016 | | |
| WO | WO 2016198674 A1 | | 12/2016 | | |

\* cited by examiner

ELECTRIC VEHICLE AND METHOD AND APPARATUS FOR CALCULATING ENDURANCE MILEAGE OF ELECTRIC VEHICLE

CROSS-REFERENCE TO RELATED APPLICATIONS

This application is the National Stage of International Application No. PCT/CN2019/079451, "Electric Vehicle and Driving Mileage Calculation Method and Device Therefor," filed on Mar. 25, 2019; which claims priority to Chinese patent application No. 201810296299.8 filed on Mar. 30, 2018. The entire content of both of the above-referenced applications is incorporated herein by reference.

FIELD

The present disclosure relates to the technical field of electric vehicles, and in particular, to a method for calculating an endurance mileage of an electric vehicle, an apparatus for calculating an endurance mileage of an electric vehicle, and an electric vehicle.

BACKGROUND

An endurance mileage of an electric vehicle refers to a distance covered by a power battery on an electric vehicle from a fully charged state to an end of a test specified by standards, which is an important economic indicator of the electric vehicle. An existing solution for calculating the endurance mileage is to directly estimate the endurance mileage based on a state of charge (SOC). An estimation expression is as follows:

$$\begin{cases} \text{Driving range } RM = k1 + SOC & 0 < SOC < SOC_{Turning\ point} \\ \text{Driving range } RM = k2 + SOC & SOC_{Turning\ point} < SOC < 100\% \end{cases}.$$

In other words, it is considered that a relationship between the SOC and the endurance mileage is a piecewise monotonic linear relationship. The relationship curve is then pre-stored in a battery management system (BMS). During calculation, the endurance mileage is directly obtained by querying a table based on a current SOC.

However, in fact, no matter from a theoretical perspective or an experimental perspective, the relationship between the endurance mileage and the SOC is not purely linear. There are many factors affecting the endurance mileage in actual operating conditions, mainly including:
  operating conditions: including driving habits of a driver, road conditions, traffic conditions, environmental factors, etc., and under different operating conditions, the same SOC corresponds to different driving ranges;
  vehicle factors: including a vehicle weight, an extra load, tire performance, transmission efficiency of a vehicle transmission system, motor efficiency, etc., all of which may affect efficiency of conversion of power battery energy into a vehicle driving range; and
  internal factors of a battery: including a battery life, a cell temperature, an internal resistance, a discharge rate, etc., all of which may affect a remaining available capacity of a power battery and affecting an endurance mileage of an electric vehicle.

SUMMARY

The present disclosure is intended to resolve at least one of the technical problems in the related art to some extent. To this end, a first purpose of the present disclosure is to propose a method for calculating an endurance mileage of an electric vehicle, so as to improve accuracy of a calculated driving range.

A second purpose of the present disclosure is to propose an apparatus for calculating an endurance mileage of an electric vehicle.

A third purpose of the present disclosure is to propose an electric vehicle.

In order to achieve the above purposes, an embodiment of a first aspect of the present disclosure proposes a method for calculating an endurance mileage of an electric vehicle, including the following steps: calculating energy consumption per unit mileage of a power battery of the electric vehicle; obtaining an open circuit voltage (OCV)-battery capacity Q reference curve of the power battery; obtaining an OCV of the power battery; obtaining current remaining available energy of the power battery according to the OCV and the OCV-Q reference curve of the power battery; and calculating the endurance mileage of the electric vehicle according to the energy consumption per unit mileage of the power battery and the current remaining available energy of the power battery.

According to the method for calculating an endurance mileage of an electric vehicle, the energy consumption per unit mileage of the power battery of the electric vehicle is calculated, and then the OCV-Q reference curve is first obtained, and the OCV is obtained, and then the current remaining available energy $E_{remaining}$ of the power battery is obtained according to the OCV and the OCV-Q reference curve, and finally the endurance mileage of the electric vehicle is calculated according to $Q_{remaining}$ and the energy consumption per unit mileage of the power battery. The endurance mileage calculated in this way is more accurate.

In addition, the method for calculating an endurance mileage of an electric vehicle according to the above embodiment of the present disclosure may further have the following additional technical features:

According to an embodiment of the present disclosure, the obtaining current remaining available energy of the power battery according to the OCV and the OCV-Q reference curve of the power battery specifically includes: calculating a current remaining available capacity $Q_{remaining}$ of the power battery according to the OCV and the OCV-Q reference curve of the power battery; and calculating the current remaining available energy according to the current remaining available capacity $Q_{remaining}$ of the power battery and the OCV of the power battery.

According to an embodiment of the present disclosure, the current remaining available energy is calculated by using the following formula:

$$E_{remaining} = \int_0^{Q_{remaining}} OCV(Q)dQ, \text{ where}$$

$E_{remaining}$ is the current remaining available energy.

According to an embodiment of the present disclosure, the OCV-Q reference curve of the power battery is obtained through real-time interaction between the electric vehicle and a cloud server.

According to an embodiment of the present disclosure, the energy consumption per unit mileage of the power battery is calculated by using the following formula:

$$D_K = \alpha D_{std} + \beta D_{actual} + \gamma D_{K-1}, \text{ where}$$

$D_{std}$ is energy consumption per unit mileage under a standard operating condition, $D_{actual}$ is energy consumption per unit mileage under an actual operating condition, $D_{K-1}$ is energy consumption per unit mileage at a previous moment, and α, β, and γ are all preset coefficients.

According to an embodiment of the present disclosure, the method for calculating an endurance mileage of an electric vehicle further includes: determining, according to $D_K$, whether the following formula $0.5D_{std} < D_K < 1.5D_{std}$ is satisfied; if yes, calculating the endurance mileage of the electric vehicle according to $D_K$; and if not, recalculating $D_K$.

According to an embodiment of the present disclosure, the endurance mileage is calculated by using the following formula:

$$RM = \frac{E_{remaining}}{D_K},$$

where

RM is the endurance mileage.

In order to achieve the above purposes, an embodiment of a second aspect of the present disclosure proposes an apparatus for calculating an endurance mileage of an electric vehicle, the apparatus including: a first calculating module configured to calculate energy consumption per unit mileage of a power battery of the electric vehicle; a first obtaining module configured to obtain an open circuit voltage (OCV)-battery capacity Q reference curve of the power battery; a second obtaining module configured to obtain an OCV of the power battery; a third obtaining module configured to obtain current remaining available energy of the power battery according to the OCV and the OCV-Q reference curve of the power battery; and a second calculating module configured to calculate the endurance mileage of the electric vehicle according to the energy consumption per unit mileage of the power battery and the current remaining available energy of the power battery.

According to the apparatus for calculating an endurance mileage of an electric vehicle, the energy consumption per unit mileage of the power battery of the electric vehicle is first calculated, and then the OCV-Q reference curve is obtained, and the OCV is obtained, and then the current remaining available energy $E_{remaining}$ of the power battery is obtained according to the OCV and the OCV-Q reference curve, and finally the endurance mileage of the electric vehicle is calculated according to $Q_{remaining}$ and the energy consumption per unit mileage of the power battery. The endurance mileage calculated in this way is more accurate.

In addition, the apparatus for calculating an endurance mileage of an electric vehicle according to the above embodiment of the present disclosure may further have the following additional technical features:

According to an embodiment of the present disclosure, the third obtaining module is specifically configured to:
calculate a current remaining available capacity $Q_{remaining}$ of the power battery according to the OCV and the OCV-Q reference curve of the power battery; and
calculate the current remaining available energy according to the current remaining available capacity $Q_{remaining}$ of the power battery and the OCV of the power battery.

According to an embodiment of the present disclosure, the current remaining available energy is calculated by using the following formula:

$E_{remaining} = \int_0^{Q_{remaining}} OCV(Q)dQ$, where $E_{remaining}$ is the current remaining available energy.

According to an embodiment of the present disclosure, the OCV-Q reference curve of the power battery is obtained through real-time interaction between the electric vehicle and a cloud server.

According to an embodiment of the present disclosure, the first calculating module calculates the energy consumption per unit mileage of the power battery by using the following formula:

$D_K = \alpha D_{std} + \beta D_{actual} + \gamma D_{K-1}$, where $D_{std}$ is energy consumption per unit mileage under a standard operating condition, $D_{actual}$ is energy consumption per unit mileage under an actual operating condition, $D_{K-1}$ is energy consumption per unit mileage at a previous moment, and α, β, and γ are all preset coefficients.

According to an embodiment of the present disclosure, the first calculating module is further configured to: determine, according to $D_K$, whether the following formula $0.5D_{std} < D_K < 1.5D_{std}$ is satisfied; if yes, calculate the endurance mileage of the electric vehicle according to $D_K$; and if not, recalculate $D_K$.

According to an embodiment of the present disclosure, the second calculating module calculates the endurance mileage by using the following formula:

$$RM = \frac{E_{remaining}}{D_K},$$

where

RM is the endurance mileage.

An embodiment of a third aspect of the present disclosure proposes an electric vehicle, including the apparatus for calculating an endurance mileage of an electric vehicle according to the above embodiment.

According to the electric vehicle of the embodiments of the present disclosure, the apparatus for calculating an endurance mileage of an electric vehicle according to the above embodiment is adopted, and the calculated driving range is more accurate.

DETAILED DESCRIPTION

Figure 1:
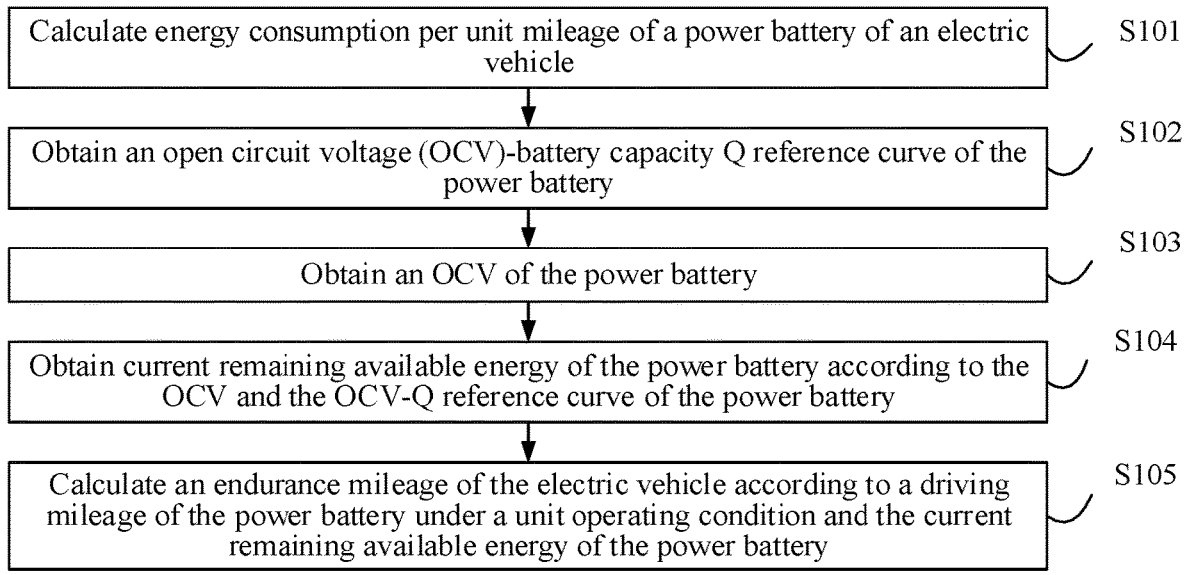
FIG. 1 is a flowchart of a method for calculating an endurance mileage of an electric vehicle according to an embodiment of the present disclosure.

Embodiments of the present disclosure are described in detail below, and examples of the embodiments are shown in the accompanying drawings, where the same or similar elements or the elements having same or similar functions are denoted by the same or similar reference numerals throughout the description. The embodiments described below with reference to the accompanying drawings are exemplary and used only for explaining the present disclosure, and should not be construed as a limitation on the present disclosure.

A method and an apparatus for calculating an endurance mileage of an electric vehicle and an electric vehicle according to the embodiments of the present disclosure are described below with reference to the drawings.

FIG. 1 is a flowchart of a method for calculating an endurance mileage of an electric vehicle according to an embodiment of the present disclosure. As shown in FIG. 1, the method for calculating an endurance mileage of an electric includes the following steps.

S101: Calculate energy consumption per unit mileage of a power battery. Energy, consumption per unit mileage or energy consumption per unit distance refers to the energy consumption per mile, kilometer, or any unit of the driving distance.

In the embodiments of the present disclosure, due to influence of various factors such as operating conditions, driving habits of a user, and a life of a power battery, etc. on the endurance mileage of the vehicle, the energy consumption per unit mileage of the power battery may be estimated based on energy consumption per unit mileage under a standard operating condition, energy consumption per unit mileage under a current operating condition, and energy consumption per unit mileage at a previous moment. Specifically, a weighted sum of the above three may be obtained, and a weight coefficient depends on actual situations. For example, the energy consumption per unit mileage of the power battery may be obtained by using the following formula (1):

$$D_K = \alpha D_{std} + \beta D_{actual} + \gamma D_{K-1} \quad (1).$$

$D_{std}$ is energy consumption per unit mileage under a standard operating condition, $D_{actual}$ is energy consumption per unit mileage under an actual operating condition, $D_{K-1}$ is energy consumption per unit mileage at a previous moment, and $\alpha$, $\beta$, and $\gamma$ are all preset coefficients. It may be understood that a unit of the above energy consumption per unit mileage is kWh/Km.

Tests may be performed in advance to obtain the energy consumption per unit mileage under the standard operating condition and energy consumption per unit mileage under various operating conditions. For example, the standard operating condition may be that the electric vehicle is running on a road surface with a slip rate of s, no slope, or a very small slope, and an ambient temperature is in a range of T1 to T2. When $D_{std}$ obtained through testing, energy consumption per 1 km of the electric vehicle may be detected under the above standard operating condition and in a case that the power battery is used for the first time and is fully charged, and then $D_{std}$ is calculated based on a detected value, for example, an average value is used.

During driving of the electric vehicle, the energy consumption per unit mileage of the power battery may be calculated by using the above formula (1) every preset time t (for example 10 min, 15 min, or 20 min, etc.). For example, during a time period t to 2t, a driving distance is L, and detected energy consumption is Q (which may be calculated according to a vehicle speed, an operating current of the power battery, a voltage of the power battery, a power of an electric load, etc.). In this case, the energy consumption per unit mileage of the electric vehicle under the actual operating condition is obtained, that is, $D_{actual} = Q/L$, the energy consumption per unit mileage at the moment t is $D_{K-1}$, and the energy consumption per unit mileage under the standard operating condition is $D_{std}$. Then energy consumption per unit mileage at the moment 2t $D_K$ may be calculated by using the above formula (1). In the formula, values of parameters $\alpha$, $\beta$, $\gamma$ may be selected according to a current actual operating condition. For example, if the current operating condition is that the slip rate is relatively large, the slope is relatively small, and the ambient temperature is relatively low, $\alpha < \beta < \gamma$, and $\alpha + \beta + \gamma = 1$. If the current operating condition is that the slip rate is relatively large, the slope is relatively small, the ambient temperature is relatively low, $D_{actual} > D_{K-1} > D_{std}$, and a slope at a previous moment is a negative value, $\alpha < \gamma < \beta$, and $\alpha + \beta + \gamma = 1$. In this way, accuracy of predicted energy consumption per unit mileage under a future operating condition can be improved. It may be understood that energy consumption per unit mileage of the power battery at an initial moment may be calculated based on $D_{std}$ and $D_{actual}$, that is, in the formula (1), $\gamma = 0$.

In a specific example of the present disclosure, if a user has good driving habits, that is, a change rate of an output power of the electric vehicle is small, after $D_K$ is calculated, it is determined according to $D_K$ whether the following formula $0.5D_{std} < D_K < 1.5D_{std}$ is satisfied. If yes, the endurance mileage of the electric vehicle is calculated. If not, $D_K$ is recalculated, to avoid unexpected random errors and guarantee accuracy of the calculated driving range.

S102: Obtain an open circuit voltage (OCV)-battery capacity Q reference curve of the power battery.

In the embodiment of the present disclosure, the OCV-Q reference curve of the power battery may be obtained through real-time interaction between the electric vehicle and a cloud server, or may be obtained from a BMS of the electric vehicle.

In an example, the OCV-Q reference curve may be pre-stored in the BMS, so that the OCV-Q reference curve may be directly obtained from the BMS when necessary.

In another example, the OCV-Q reference curve may be pre-stored in a cloud server, for example, the OCV-Q reference curve may be stored in the cloud server through the BMS of the electric vehicle. Furthermore, when necessary, a wireless connection may be established between the electric vehicle and the cloud server through 2G/3G/4G/5G, WIFI, etc., so that the BMS of the electric vehicle may obtain the pre-stored OCV-Q reference curve from the cloud server.

It should be noted that, due to factors such as aging of the power battery, etc., in order to ensure that the OCV-Q reference curve of the power battery is closer to a current real state of the power battery, the OCV-Q reference curve of the power battery may be monitored and stored in real time through the BMS, so as to update the OCV-Q reference curve stored in the BMS and/or cloud server regularly (for example, every one week, every one month, every three months, etc.).

Figure 2:
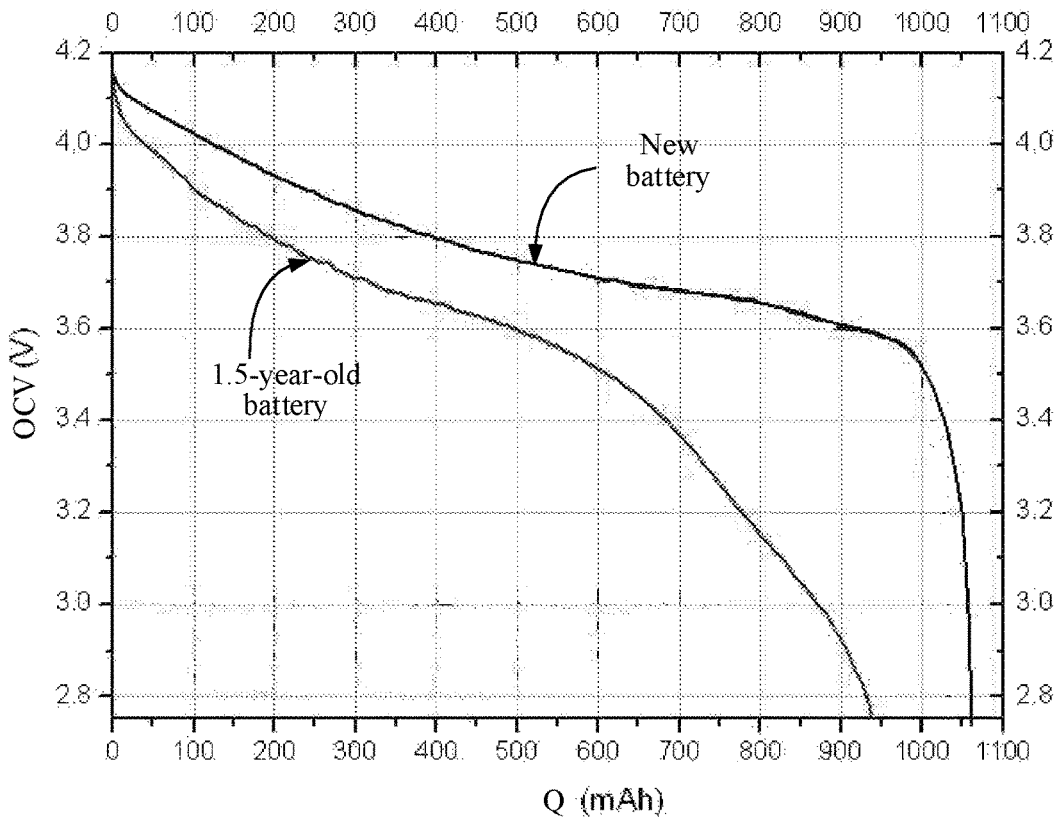
FIG. 2 is a schematic diagram of an OCV-Q reference curve according to an embodiment of the present disclosure.

In a specific example, OCV-Q curves of a new battery and a 1.5-year-old battery are shown in FIG. 2. It may be learned from FIG. 2 that, when open circuit voltages are the same, a capacity of the 1.5-year-old battery is significantly smaller than a capacity of a new battery.

S103: Obtain an OCV of the power battery.

The OCV may be obtained through a pulse charge and discharge test. A charge rate and a pulse interval time in the test may be set as required.

For example, a discharge module and a shunt may be connected in series at two ends of the power battery, and operation of the discharge module may be controlled by using a controller. The discharge module may be set according to the charge rate and the pulse interval time that are set. When the discharge module is idle, a voltage U1 across the discharge module and a current I1 of the shunt are collected.

When the discharge module is working, a voltage U2 across the discharge module and a current I2 of the shunt are collected.

Assuming that an internal resistance of the power battery is r, OCV=U1+I1*r and OCV=U2+I2*r, and the open circuit voltage (OCV)=(U1*I2−U2*I1)/(I2−I1).

S104: Obtain current remaining available energy of the power battery according to the OCV and the OCV-Q reference curve of the power battery.

A current remaining available capacity $Q_{remaining}$ of the power battery may be obtained by querying the OCV-Q reference curve according to the OCV of the power battery, and then the current remaining available energy $E_{remaining}$ may be calculated according to the current remaining available capacity $Q_{remaining}$ and the OCV of the power battery.

In an embodiment of the present disclosure, the calculation formula is specifically the following formula (2):

$$E_{remaining}=\int_0^{Q_{remaining}} OCV(Q)dQ \qquad (2).$$

In an embodiment of the present disclosure, during calculation of the energy consumption per unit mileage of the power battery in step S101, energy consumption at a current moment may also be obtained by obtaining a difference between the current remaining available energy and remaining available energy at a previous moment.

S105: Calculate the endurance mileage of the electric vehicle according to the energy consumption per unit mileage and the current remaining available energy of the power battery.

In a specific example of the present disclosure, the endurance mileage may be calculated by using the following formula (3):

$$RM = \frac{E_{remaining}}{D_K}. \qquad (3)$$

RM is the endurance mileage.

According to the method for calculating an endurance mileage of an electric vehicle, the energy consumption per unit mileage of the power battery of the electric vehicle is calculated, and then the OCV-Q reference curve is first obtained, and the OCV is obtained, and then the current remaining available energy $E_{remaining}$ of the power battery is obtained according to the OCV and the OCV-Q reference curve, and finally the endurance mileage of the electric vehicle is calculated according to $Q_{remaining}$ and the energy consumption per unit mileage of the power battery. The endurance mileage calculated in this way is more accurate. In addition, the OCV-Q reference curve is obtained through interaction with the cloud server, so that more accurate driving habits of different users and use environment of the vehicle can be learned, thereby providing a data platform for subsequent big data applications.

Figure 3:
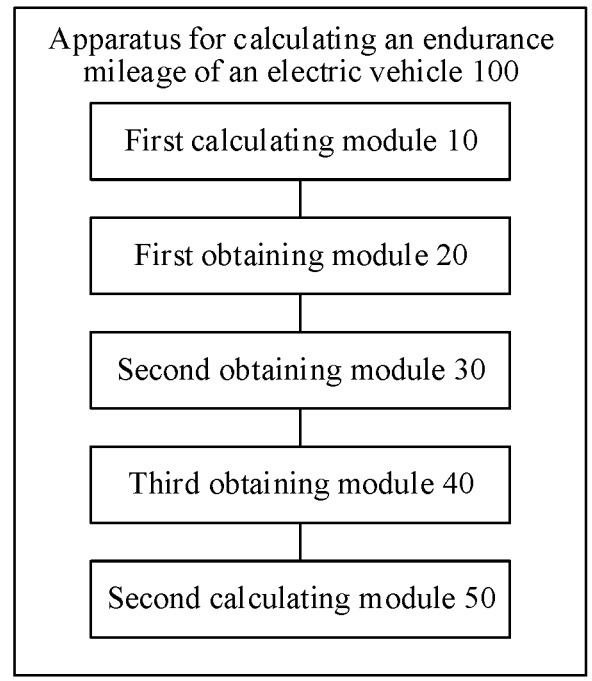
FIG. 3 is a structural block diagram of an apparatus for calculating an endurance mileage of an electric vehicle according to an embodiment of the present disclosure.

FIG. 3 is a structural block diagram of an apparatus for calculating an endurance mileage of an electric vehicle according to an embodiment of the present disclosure. As shown in FIG. 3, an apparatus 100 for calculating an endurance mileage of an electric vehicle includes: a first calculating module 10, a first obtaining module 20, a second obtaining module 30, a third obtaining module 40, and a second calculating module 50.

The first calculating module 10 is configured to calculate energy consumption per unit mileage of a power battery.

In an embodiment of the present disclosure, due to influence of various factors such as operating conditions, driving habits of a user, and a life of a power battery, etc. on the endurance mileage of the vehicle, the energy consumption per unit mileage of the power battery may be estimated based on energy consumption per unit mileage under a standard operating condition, energy consumption per unit mileage under a current operating condition, and energy consumption per unit mileage at a previous moment. Specifically, a weighted sum of the above three may be obtained, and a weight coefficient depends on actual situations. For example, the first calculating module 10 may calculate the energy consumption per unit mileage of the power battery by using the following formula (1):

$$D_K=\alpha D_{std}+\beta D_{actual}+\gamma D_{K-1} \qquad (1).$$

$D_{std}$ is energy consumption per unit mileage under a standard operating condition, $D_{actual}$ is energy consumption per unit mileage under an actual operating condition, $D_{K-1}$ is energy consumption per unit mileage at a previous moment, and α, β, and γ are all preset coefficients. It may be understood that a unit of the above energy consumption per unit mileage is kWh/Km.

Tests may be performed in advance to obtain the energy consumption per unit mileage under the standard operating condition and energy consumption per unit mileage under various operating conditions. For example, the standard operating condition may be that the electric vehicle is running on a road surface with a slip rate of s, no slope, or a very small slope, and an ambient temperature is in a range of T1 to T2. When $D_{std}$ is obtained through testing, energy consumption per 1 km of the electric vehicle may be detected under the above standard operating condition and in a case that the power battery is used for the first time and is fully charged, and then $D_{std}$ is calculated based on a detected value, for example, an average value is used.

During driving of the electric vehicle, the energy consumption per unit mileage of the power battery may be calculated by using the above formula (1) every preset time t (for example 10 min, 15 min, or 20 min, etc.). For example, during a time period t to 2t, a driving distance is L, and detected energy consumption is Q. In this case, the energy consumption per unit mileage of the electric vehicle under the actual operating condition is obtained, that is, $D_{actual}=Q/L$, energy consumption per unit mileage at the moment t is $D_{K-1}$, and the energy consumption per unit mileage under the standard operating condition is $D_{std}$. Then energy consumption per unit mileage at the moment 2t $D_K$ may be calculated by using the above formula (1). In the formula, values of parameters α, β, and γ may be selected according to a current actual operating condition. For example, if the current operating condition is that the slip rate is relatively large, the slope is relatively small, and the ambient temperature is relatively low, α<β<γ, and α+β+γ=1. If the current operating condition is that the slip rate is relatively large, the slope is relatively small, the ambient temperature is relatively low, $D_{actual}>D_{K-1}>D_{std}$, and a slope at a previous moment is a negative value, α<γ<β, and α+β+γ=1. In this way, accuracy of predicted energy consumption per unit mileage under a future operating condition can be improved. It may be understood that energy consumption per unit mileage of the power battery at an initial moment may be calculated based on $D_{std}$ and $D_{actual}$, that is, in the formula (1), γ=0.

In a specific example of the present disclosure, if a user has good driving habits, that is, a change rate of an output power of the electric vehicle is small, after the first calculating module 10 calculates $D_K$, it is determined according to $D_K$ whether the following formula $0.5D_{std}<D_K<1.5D_{std}$ is satisfied. If yes, the endurance mileage of the electric vehicle is calculated. If not, $D_K$ is recalculated, to avoid unexpected random errors and guarantee accuracy of the calculated driving range.

The first obtaining module 20 is configured to obtain an open circuit voltage (OCV)-battery capacity Q reference curve of the power battery.

In the embodiment of the present disclosure, the OCV-Q reference curve of the power battery may be obtained through real-time interaction between the electric vehicle and a cloud server, or may be obtained from a BMS of the electric vehicle.

In an example, the OCV-Q reference curve may be pre-stored in the BMS, so that the first obtaining module 20 may directly obtain an OCV-Q reference curve from the BMS when necessary.

In another example, the OCV-Q reference curve may be pre-stored in a cloud server, for example, the OCV-Q reference curve may be stored in the cloud server through the BMS of the electric vehicle. Furthermore, when necessary, a wireless connection may be established between the electric vehicle and the cloud server through 2G/3G/4G/5G, WIFI, etc., so that the first obtaining module 20 may obtain the pre-stored OCV-Q reference curve from the cloud server.

It should be noted that, due to factors such as aging of the power battery, etc., in order to ensure that the OCV-Q reference curve of the power battery is closer to a current real state of the power battery, the OCV-Q reference curve of the power battery may be monitored and stored in real time through the BMS, so as to update the OCV-Q reference curve stored in the BMS and/or cloud server regularly (for example, every one week, every one month, every three months, etc.).

In a specific example, OCV-Q curves of a new battery and a 1.5-year-old battery are shown in FIG. 2. It may be learned from FIG. 2 that, when open circuit voltages are the same, a capacity of the 1.5-year-old battery is significantly smaller than a capacity of a new battery.

The second obtaining module 30 is configured to obtain an OCV of the power battery.

The OCV may be obtained through a pulse charge and discharge test. A charge rate and a pulse interval time in the test may be set as required.

For example, a discharge module and a shunt may be connected in series at two ends of the power battery, and operation of the discharge module may be controlled by using a controller. The discharge module may be set according to the charge rate and the pulse interval time that are set. When the discharge module is idle, a voltage U1 across the discharge module and a current I1 of the shunt are collected. When the discharge module is working, a voltage U2 across the discharge module and a current I2 of the shunt are collected.

Assuming that an internal resistance of the power battery is r, OCV=U1+I1*r and OCV=U2+I2*r, and the open circuit voltage (OCV)=(U1*I2−U2*I1)/(I2−I1).

The third obtaining module 40 is configured to obtain current remaining available energy of the power battery according to the OCV and the OCV-Q reference curve of the power battery.

The third obtaining module 40 may obtain a current remaining available capacity $Q_{remaining}$ of the power battery by querying the OCV-Q reference curve according to the OCV of the power battery, and then calculate the current remaining available energy $E_{remaining}$ according to the current remaining available capacity $Q_{remaining}$ and the OCV of the power battery. The calculation formula is specifically the following formula (2):

$$E_{remaining} = \int_0^{Q_{remaining}} OCV(Q)dQ \qquad (2).$$

The second calculating module 50 is configured to calculate the endurance mileage of the electric vehicle according to the energy consumption per unit mileage of the power battery and the current remaining available capacity of the power battery.

In a specific example of the present disclosure, second calculating module 50 may calculate the endurance mileage by using the following formula (3):

$$RM = \frac{E_{remaining}}{D_K}. \qquad (3)$$

RM is the endurance mileage.

In a specific example of the present disclosure, if a user has good driving habits, that is, a change rate of an output power of the electric vehicle is small, the first calculating module 10 may be further configured to: determine, according to $D_K$, whether the following formula $0.5D_{std} < D_K < 1.5D_{std}$ is satisfied; if yes, calculate the endurance mileage of the electric vehicle according to $D_K$; and if not, recalculate $D_K$.

According to the apparatus for calculating an endurance mileage of an electric vehicle, the energy consumption per unit mileage of the power battery of the electric vehicle is first calculated, and then the OCV-Q reference curve is obtained, and the OCV is obtained, and then the current remaining available energy $E_{remaining}$ of the power battery is obtained according to the OCV and the OCV-Q reference curve, and finally the endurance mileage of the electric vehicle is calculated according to $Q_{remaining}$ and the energy consumption per unit mileage of the power battery. The endurance mileage calculated in this way is more accurate. In addition, the OCV-Q reference curve is obtained through interaction with the cloud server, so that more accurate driving habits of different users and use environment of the vehicle can be learned, thereby providing a data platform for subsequent big data applications.

Figure 4:
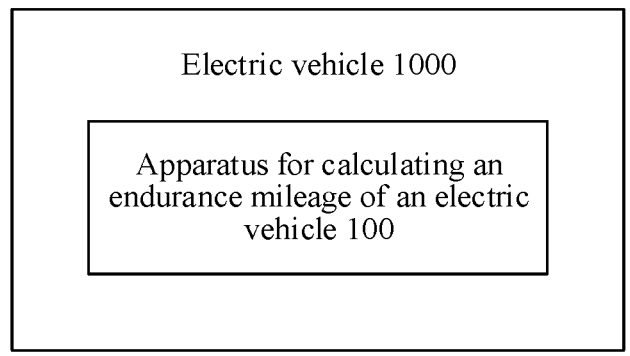
FIG. 4 is a structural block diagram of an electric vehicle according to an embodiment of the present disclosure.

FIG. 4 is a structural block diagram of an electric vehicle according to an embodiment of the present disclosure. As shown in FIG. 4, an electric vehicle 1000 includes the apparatus 100 for calculating an endurance mileage of an electric vehicle according to the above embodiment.

According to the electric vehicle of the embodiment of the present disclosure, the apparatus for calculating an endurance mileage of an electric vehicle according to the above embodiment is adopted, and the calculated driving range is more accurate. In addition, the OCV-Q reference curve is obtained through interaction with the cloud server, so that more accurate driving habits of different users and use environment of the vehicle can be learned, thereby providing a data platform for subsequent big data applications.

It should be noted that other components and functions of the electric vehicle in the embodiments of the present disclosure are known to those skilled in the art, and in order to reduce redundancy, details are not described herein.

In the description of this specification, the description of the reference terms "an embodiment", "some embodiments", "an example", "a specific example", "some examples," and the like means that specific features, structures, materials or characteristics described in combination with the embodiment(s) or example(s) are included in at least one embodiment or example of the present disclosure. In this specification, exemplary representations of the above terms do not necessarily refer to the same embodiment or example. Moreover, the described specific features, structures, materials or characteristics may be combined in a suitable manner in any one or more embodiments or examples. In addition, in a case that is not mutually contradictory, a person skilled in the art can combine or group different embodiments or examples that are described in this specification and features of the different embodiments or examples.

In addition, terms "first" and "second" are used only for a purpose of description, and shall not be construed as indicating or implying relative importance or implying a quantity of indicated technical features. Therefore, a feature restricted by "first" or "second" may explicitly indicate or implicitly include one or more such features. In description of the present disclosure, "multiple" means at least two, such as two and three unless it is specifically defined otherwise.

A description of any process or method in the flowcharts or described herein in another manner can be construed as representing one or more modules, fragments, or parts that include executable instructions used to implement a specific logical function or steps of a process. In addition, the scope of the exemplary implementations of the present disclosure includes another implementation, where functions can be performed not in an order shown or discussed, including performing the functions basically at the same time or in reverse order according to the functions involved. This should be understood by a person skilled in the technical field to which the embodiments of the present disclosure belong.

Logic and/or steps shown in the flowcharts or described herein in other manners, for example, may be considered as a program list of executable instructions that are used to implement logic functions, and may be specifically implemented on any computer-readable medium, for an instruction execution system, apparatus, or device (for example, a computer-based system, a system including a processor, or another system that can fetch instructions from the instruction execution system, apparatus, or device and execute the instructions) to use, or for a combination of the instruction execution system, apparatus, or device to use. In the context of this specification, a "computer-readable medium" may be any apparatus that can include, store, communicate, propagate, or transmit the program for use by the instruction execution system, apparatus, or device or in combination with the instruction execution system, apparatus, or device. More specific examples (a nonexhaustive list) of the computer-readable medium include the following: an electrical connection (electronic apparatus) having one or more wires, a portable computer diskette (magnetic apparatus), a random access memory (RAM), a read-only memory (ROM), an erasable programmable read-only memory (EPROM or flash memory), an optical fiber apparatus, and a portable compact disk read-only memory (CDROM). In addition, the computer-readable medium may even be a piece of paper for printing the program or another proper medium, because, for example, optical scanning may be performed on the paper or another medium, and then processing is performed by performing editing and decryption, or in another proper manner to obtain the program in an electronic manner. Then the program is stored in a computer memory.

It should be understood that, parts of the present disclosure can be implemented by using hardware, software, firmware, or a combination thereof. In the foregoing implementations, a plurality of steps or methods may be implemented by using software or firmware that are stored in a memory and are executed by a proper instruction execution system. For example, if being implemented by hardware, like another implementation, the plurality of steps or methods may be implemented by any one of following common technologies in the art or a combination thereof: a discrete logic circuit of a logic gate circuit for realizing a logic function for a data signal, an application specific integrated circuit having a suitable combined logic gate circuit, a programmable gate array (PGA), and a field programmable gate array (FPGA).

What is claimed is:

1. A method for calculating an endurance mileage of an electric vehicle, comprising:
    calculating, by a processor, energy consumption per unit distance of a power battery of the electric vehicle by using a first formula:

$D_K = \alpha D_{std} + \beta D_{actual} + \gamma D_{K-1}$, wherein $D_{std}$ is energy consumption per unit distance under a standard operating condition, $D_{actual}$ is energy consumption per unit distance under an actual operating condition, $D_{K-1}$ is energy consumption per unit distance at a previous moment, K is an integer, and $\alpha$, $\beta$, and $\gamma$ are coefficients;
    selecting $\alpha$, $\beta$, and V based on a current actual operating condition to improve accuracy of predicting an energy consumption per unit distance under a future operating condition of the electric vehicle;
    obtaining, by the processor, an open circuit voltage battery capacity (OCV-Q) reference curve of the power battery;
    measuring an open circuit voltage (OCV) of the power battery, and obtaining, by the processor, the OCV of the power battery;
    obtaining, by the processor, current remaining available energy of the power battery according to the OCV and the OCV-Q reference curve of the power battery; and
    calculating, by the processor, the endurance mileage of the electric vehicle according to the energy consumption per unit distance of the power battery and the current remaining available energy of the power battery.

2. The method for calculating an endurance mileage of an electric vehicle according to claim 1, wherein the obtaining current remaining available energy of the power battery according to the OCV and the OCV-Q reference curve of the power battery comprises:
    calculating a current remaining available capacity $Q_{remaining}$ of the power battery according to the OCV and the OCV-Q reference curve of the power battery; and
    calculating the current remaining available energy according to the current remaining available capacity $Q_{remaining}$ of the power battery and the OCV of the power battery.

3. The method for calculating an endurance mileage of an electric vehicle according to claim 1, wherein the current remaining available energy is calculated by using a second formula:

$E_{remaining} = \int_0^{Q_{remaining}} OCV(Q) dQ$, wherein $E_{remaining}$ is the current remaining available energy.

4. The method for calculating an endurance mileage of an electric vehicle according to claim 1, wherein the OCV-Q reference curve of the power battery is obtained through real-time interaction between the electric vehicle and a cloud server.

5. The method for calculating an endurance mileage of an electric vehicle according to claim 1, further comprising:

determining, according to $D_K$, whether $D_K$ is greater than $0.5D_{std}$ and less than $1.5D_{std}$;

in response to that $D_K$ is greater than $0.5D_{std}$ and less than $1.5D_{std}$, calculating the endurance mileage of the electric vehicle according to $D_K$; and in response to that $D_K$ is not greater than $0.5D_{std}$ or not less than $1.5D_{std}$, recalculating $D_K$.

6. The method for calculating an endurance mileage of an electric vehicle according to claim 1, wherein the endurance mileage is calculated by using a third formula:

$$RM = \frac{E_{remaining}}{D_K},$$

wherein RM is the endurance mileage and $E_{remaining}$ is the current remaining available energy.

7. An apparatus for calculating an endurance mileage of an electric vehicle, the apparatus comprising a processor and a non-transitory computer-readable storage medium storing instructions executable by the processor to cause the apparatus to perform operations comprising:

calculating energy consumption per unit distance of a power battery of the electric vehicle by using a first formula:

$$D_K = \alpha D_{std} + \beta D_{actual} + \gamma D_{K-1},$$

wherein $D_{std}$ is energy consumption per unit distance under a standard operating condition, $D_{actual}$ is energy consumption per unit distance under an actual operating condition, $D_{K-1}$ is energy consumption per unit distance at a previous moment, K is an integer, and $\alpha$, $\beta$, and $\gamma$ are coefficients;

selecting $\alpha$, $\beta$, and v based on a current actual operating condition to improve accuracy of predicting an energy consumption per unit distance under a future operating condition of the electric vehicle;

obtaining an open circuit voltage-battery capacity (OCV-Q) reference curve of the power battery;

measuring an open circuit voltage (OCV) of the power battery;

obtaining current remaining available energy of the power battery according to the OCV and the OCV-Q reference curve of the power battery; and calculating the endurance mileage of the electric vehicle according to the energy consumption per unit distance of the power battery and the current remaining available energy of the power battery.

8. The apparatus for calculating an endurance mileage of an electric vehicle according to claim 7, wherein the obtaining current remaining, available energy of the power battery according to the OCV and the OCV-Q reference curve of the power battery comprises:

calculating a current remaining available capacity $Q_{remaining}$ of the power battery according to the OCV and the OCV-Q reference curve of the power battery; and calculating the current remaining available energy according to the current remaining available capacity $Q_{remaining}$ of the power battery and the OCV of the power battery.

9. The apparatus for calculating an endurance mileage of an electric vehicle according to claim 7, wherein the current remaining available energy is calculated by using a second formula:

$$E_{remaining} = \int_0^{Q_{remaining}} OCV(Q)dQ,$$

wherein $E_{remaining}$ is the current remaining available energy.

10. The apparatus for calculating an endurance mileage of an electric vehicle according to claim 7, wherein the OCV-Q reference curve of the power battery is obtained through real-time interaction between the electric vehicle and a cloud server.

11. The apparatus for calculating an endurance mileage of an electric vehicle according to claim 7, wherein the operations further comprise:

determining, according to $D_K$, whether $D_K$ is greater than $0.5D_{std}$ and less than $1.5D_{std}$;

in response to that $D_K$ is greater than $0.5D_{std}$ and less than $1.5D_{std}$, calculating the endurance mileage of the electric vehicle according to $D_K$; and in response to that $D_K$ is not greater than $0.5D_{std}$ or not less than $1.5D_{std}$, recalculating $D_K$.

12. The apparatus for calculating an endurance mileage of an electric vehicle according to claim 7, wherein the endurance mileage is calculated by using a third formula:

$$RM = \frac{E_{remaining}}{D_K},$$

Wherein RM is the endurance mileage and $E_{remaining}$ is the current remaining available energy.

13. An electric vehicle, comprising:

a power battery; and an apparatus for calculating an endurance mileage of the electric vehicle, the apparatus comprising a processor and a non-transitory computer-readable storage medium storing instructions executable by the processor to cause the apparatus to perform operations comprising:

calculating energy consumption per unit distance of the power battery of the electric vehicle by using a first formula:

$$D_K = \alpha D_{std} + \beta D_{actual} + \gamma D_{K-1},$$

wherein $D_{std}$ is energy consumption per unit distance under a standard operating condition, $D_{actual}$ is energy consumption per unit distance under an actual operating condition, $D_{K-1}$ is energy consumption per unit distance at a previous moment, K is an integer, and $\alpha$, $\beta$, and $\gamma$ are coefficients;

selecting $\alpha$, $\beta$, and v based on a current actual operating condition to improve accuracy of predicting an energy consumption per unit distance under a future operating condition of the electric vehicle;

obtaining an open circuit voltage-battery capacity (OCV-Q) reference curve of the power battery;

measuring an open circuit voltage (OCV) of the power battery;

obtaining current remaining available energy of the power battery according to the OCV and the OCV-Q reference curve of the power battery; and calculating the endurance mileage of the electric vehicle according to the energy consumption per unit distance of the power battery and the current remaining available energy of the power battery.

14. The method for calculating an endurance mileage of an electric vehicle according to claim 1, wherein the OCV-Q reference curve of the power battery is obtained from a battery management system in the electric vehicle.

15. The method for calculating an endurance mileage of an electric vehicle according to claim 1, further comprising:

updating the OCV-Q reference curve regularly.

16. The method for calculating an endurance mileage of an electric vehicle according to claim 1, wherein the OCV of the power battery is obtained through a pulse charge and discharge test.

17. The method for calculating an endurance mileage of an electric vehicle according to claim 16, wherein the pulse charge and discharge test comprises:
   setting a charge rate and a pulse interval time in the pulse charge and discharge test.

18. The method for calculating an endurance mileage of an electric vehicle according to claim 1, wherein $\alpha+\beta+\gamma=1$.

* * * * *